United States Patent
Olac-Vaw et al.

(10) Patent No.: US 10,964,690 B2
(45) Date of Patent: Mar. 30, 2021

(54) RESISTOR BETWEEN GATES IN SELF-ALIGNED GATE EDGE ARCHITECTURE

(71) Applicant: INTEL CORPORATION, Santa Clara, CA (US)

(72) Inventors: Roman W. Olac-Vaw, Hillsboro, OR (US); Walid M. Hafez, Portland, OR (US); Chia-Hong Jan, Portland, OR (US); Hsu-Yu Chang, Hillsboro, OR (US); Neville L. Dias, Hillsboro, OR (US); Rahul Ramaswamy, Hillsboro, OR (US); Nidhi Nidhi, Hillsboro, OR (US); Chen-Guan Lee, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/474,896

(22) PCT Filed: Mar. 31, 2017

(86) PCT No.: PCT/US2017/025589
§ 371 (c)(1),
(2) Date: Jun. 28, 2019

(87) PCT Pub. No.: WO2018/182736
PCT Pub. Date: Oct. 4, 2018

(65) Prior Publication Data
US 2020/0043914 A1 Feb. 6, 2020

(51) Int. Cl.
*H01L 27/06* (2006.01)
*H01L 21/8234* (2006.01)
(Continued)

(52) U.S. Cl.
CPC .. *H01L 27/0629* (2013.01); *H01L 21/823431* (2013.01); *H01L 21/823437* (2013.01);
(Continued)

(58) Field of Classification Search
CPC .................................................. H01L 27/0629
See application file for complete search history.

(56) References Cited

U.S. PATENT DOCUMENTS

| 7,687,859 B2 | 3/2010 | Russ et al. |
| 2009/0045450 A1 | 2/2009 | Koo et al. |

(Continued)

FOREIGN PATENT DOCUMENTS

| JP | 2010067635 A | 3/2010 |
| KR | 20090017041 A | 2/2009 |

(Continued)

OTHER PUBLICATIONS

International Preliminary Report on Patentability received for PCT Application No. PCT/US2017/025589. dated Oct. 10, 2019. 7 pages.

(Continued)

*Primary Examiner* — William A Harriston
(74) *Attorney, Agent, or Firm* — Schwabe, Williamson & Wyatt, P.C.

(57) ABSTRACT

Techniques are disclosed for forming semiconductor structures including resistors between gates on self-aligned gate edge architecture. A semiconductor structure includes a first semiconductor fin extending in a first direction, and a second semiconductor fin adjacent to the first semiconductor fin, extending in the first direction. A first gate structure is disposed proximal to a first end of the first semiconductor fin and over the first semiconductor fin in a second direction, orthogonal to the first direction, and a second gate structure is disposed proximal to a second end of the first semicon- (Continued)

ductor fin and over the first semiconductor fin in the second direction. A first structure comprising isolation material is centered between the first and second semiconductor fins. A second structure comprising resistive material is disposed in the first structure, the second structure extending at least between the first gate structure and the second gate structure.

20 Claims, 12 Drawing Sheets

(51) Int. Cl.
*H01L 27/088* (2006.01)
*H01L 29/06* (2006.01)
*H01L 49/02* (2006.01)

(52) U.S. Cl.
CPC .. *H01L 21/823481* (2013.01); *H01L 27/0886* (2013.01); *H01L 28/24* (2013.01); *H01L 29/0653* (2013.01)

(56) References Cited

U.S. PATENT DOCUMENTS

| | | |
|---|---|---|
| 2010/0252895 A1 | 10/2010 | Kakoschke et al. |
| 2013/0270620 A1* | 10/2013 | Hu ..................... H01L 29/7851 |
| | | 257/296 |
| 2014/0319623 A1 | 10/2014 | Tsai et al. |
| 2017/0040324 A1 | 2/2017 | Yang et al. |

FOREIGN PATENT DOCUMENTS

| | | |
|---|---|---|
| WO | 2018063259 A | 4/2018 |
| WO | 2018118087 A | 6/2018 |
| WO | 2018182736 A1 | 10/2018 |

OTHER PUBLICATIONS

International Search Report and Written Opinion received for PCT Application No: PCT/US2017/025589. dated Dec. 27, 2017. 10 pages.

* cited by examiner

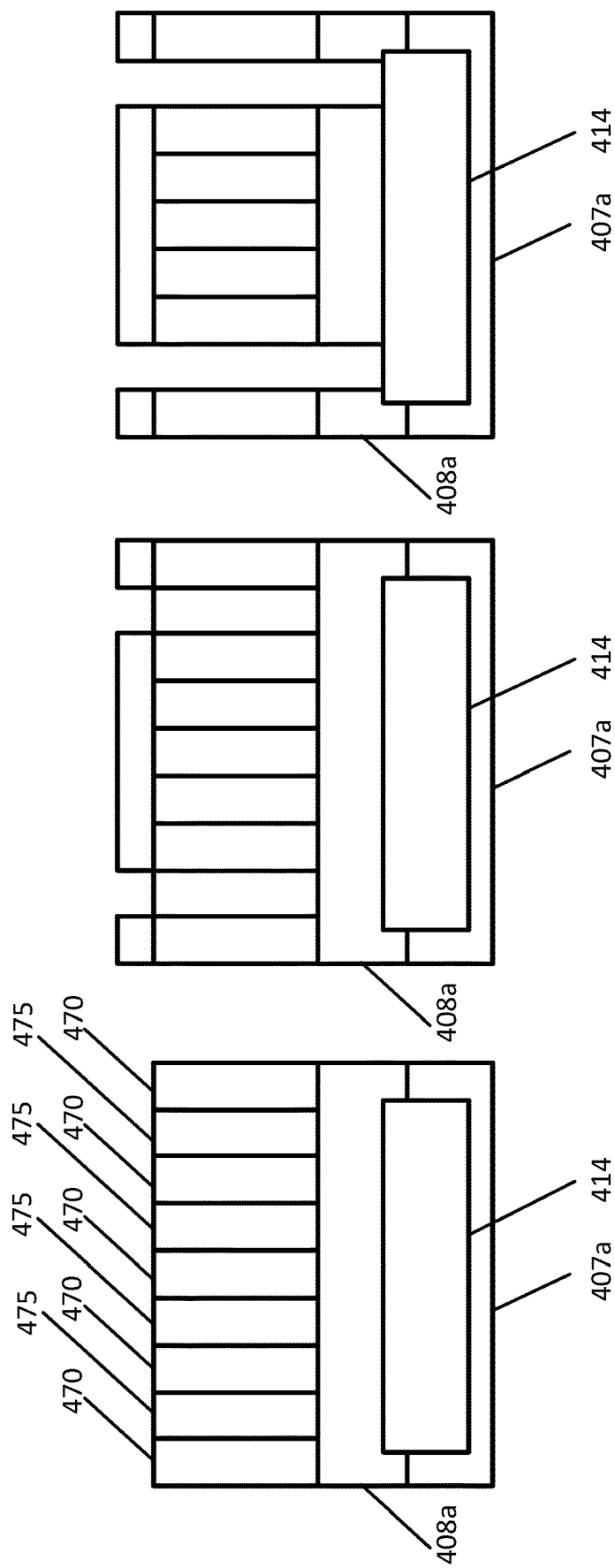

RESISTOR BETWEEN GATES IN SELF-ALIGNED GATE EDGE ARCHITECTURE

CROSS-REFERENCE TO RELATED APPLICATIONS

This patent application is a U.S. National Phase Application under 35 U.S.C. § 371 of International Application No. PCT/US2017/025589, filed on Mar. 31, 2017, the entire contents of which is hereby incorporated by reference herein.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory or logic devices on a chip, leading to the fabrication of products with increased capacity. The drive for ever-more capacity, however, is not without issue. The necessity to optimize the performance of each device becomes increasingly significant.

Increased performance of circuit devices including transistors, diodes, resistors, capacitors, and other passive and active electronic devices formed on a semiconductor substrate is typically a major factor considered during design, manufacture, and operation of those devices. Precision resistors are a fundamental component of integrated circuit structures, such as system-on-chip (SoC) technology. For instance, such resistors enable high speed analog circuitry (e.g., CSI/SERDES) and scaled input/output (IO) architecture due to characteristics such as low variation in resistivity and near-zero temperature coefficients. In particular, the resistivity of the precision resistor does not change significantly over a range of operating temperatures of the device. As aggressive device scaling continues, there are a number of non-trivial issues that arise.

BRIEF DESCRIPTION OF THE DRAWINGS

FIGS. 4A to 4I illustrate structures that are formed when carrying out the method of FIG. 3, in accordance to an embodiment of this disclosure.

Figure 1:
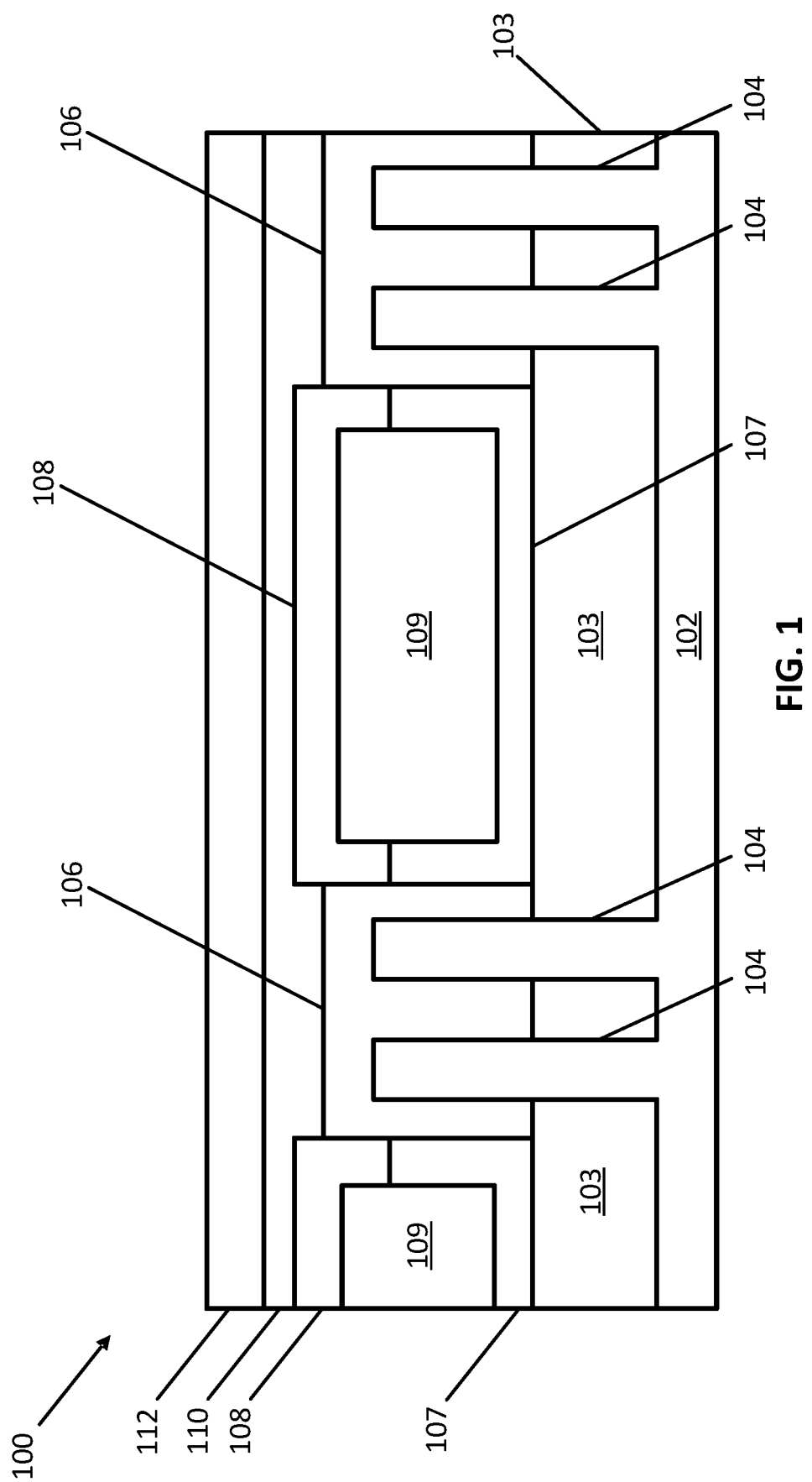
FIG. 1 illustrates a semiconductor structure including self-aligned gate self-aligned gate edge isolation structures.

The figures depict various embodiments of the present disclosure for purposes of illustration only. In the drawings, each identical or nearly identical component that is illustrated in various figures may be represented by a like numeral. For purposes of clarity, not every component may be labeled in every drawing. As will be appreciated, the figures are not necessarily drawn to scale or intended to limit the present disclosure to the specific configurations shown. For instance, while some figures generally indicate straight lines, right angles, and smooth surfaces, an actual implementation of a transistor structure may have less than perfect straight lines, right angles, and some features may have surface topology or otherwise be non-smooth, given real world limitations of the processing equipment and techniques used. In short, the figures are provided merely to show example structures. Numerous variations, configurations, and other embodiments will be apparent from the following detailed discussion.

DETAILED DESCRIPTION

Techniques are disclosed for forming semiconductor structures including resistors between gates in self-aligned gate edge architecture. In more detail, a semiconductor structure includes a first semiconductor fin extending in a first direction, and a second semiconductor fin adjacent to the first semiconductor fin and extending in the first direction. The semiconductor structure further includes a first gate structure proximal to a first end of the first semiconductor fin and over the first semiconductor fin in a second direction, the first gate structure orthogonal to the first direction, and a second gate structure proximal to a second end of the first semiconductor fin and over the first semiconductor fin in the second direction. A first structure is centered between the first and second semiconductor fins, the first structure comprising isolation material. A second structure is disposed in the first structure, the second structure extending at least between the first gate structure and the second gate structure and comprising resistive material, the second structure being electrically isolated from the first and second gate structures. Thus, the resistor need not be placed in the metallization layer above the device layer as typically done, thereby avoiding the topography and scaling issues associated with such resistors. The disclosed resistor structures and techniques may further provide various other advantages over standard resistor techniques, such as a larger area of resistive material, improved thermal conduction and heat dissipation, and reduced routing overhead to connect to active circuitry.

General Overview

As previously noted, there are a number of non-trivial issues that arise as device scaling continues. For instance, resistors are typically formed above the device layer in the lower back-end metallization layers, which are inherently planar. The addition of a thin-film resistor at these locations introduces topography. At scaled nodes, the relevant depth of focus associated with such topography creates patterning issues for the tightly spaced metallization lines. Integrating resistors into a highly scaled self-aligned gate edge architecture according to some embodiments provided herein avoids or otherwise lessens such scalability issues, while still allowing the resistor elements to be close to the device layer. In addition, a self-aligned gate edge-based precision resistor structure enables a defect-free (or otherwise relatively low defect) process with low variation in resistivity and good thermal conduction due to the proximity to the substrate, thereby allowing for better heat dissipation and further lowering the temperature coefficients of the precision resistors. As an additional benefit, reduced routing overhead is needed to connect to active circuitry, due to the close proximity to active transistors.

In more detail, a self-aligned gate edge processing scheme involves the formation of gate/trench contact endcaps self-aligned to and centered between fins. FIG. 1 illustrates a cross-sectional view of a semiconductor structure 100 including two self-aligned gate edge isolation structures that each include a self-aligned gate edge liner 107, a self-aligned gate edge cap 108, and a self-aligned gate edge body 109, as taken through a fin cut perspective (perpendicular to the fins 104 and through the gate/channel region). The semiconductor structure 100 includes a plurality of semiconductor fins 104 above a substrate 102. The semiconductor substrate 102 may be implemented, for example, with a bulk silicon or a silicon-on-insulator substrate configuration. In some implementations, the semiconductor substrate 102 may be formed using crystalline silicon. In other implementations, the semiconductor substrate 102 may be formed using alternate materials, which may or may not be combined with silicon, such as germanium, silicon germanium, indium antimonide, lead telluride, indium arsenide, indium phosphide, indium gallium arsenide, gallium arsenide, or gallium antimonide. In a more general sense, any material that may serve as a foundation upon which a semiconductor device may be built or otherwise formed can be used in accordance with embodiments of the present disclosure. The plurality of semiconductor fins 104 is continuous with and protrudes from the substrate 102, through an insulator layer 103. Insulator layer 103 can be formed from any suitable insulator material, such as, for example, silicon dioxide.

A gate structure 106 is over a grouping of one or more of the plurality of semiconductor fins 104. For example, two gate structures 106 are depicted, each formed over a pair of semiconductor fins 104. The gate structure 106 includes a gate dielectric layer (which may be high-k gate dielectric material) and a gate electrode. In an example case, the gate structure 106 includes a silicon dioxide gate dielectric layer and a polysilicon or tungsten gate electrode. In still other embodiments, the gate dielectric layer includes multiple components such as a lower layer of silicon dioxide on the channel region, and an upper layer of hafnium oxide on the silicon dioxide layer. Likewise, the gate electrode structure may include multiple components in some embodiments, such as work function metals and/or barrier materials surrounding a metal core or plug. Any number of gate stack configurations can be used, whether high-k or not, as will be appreciated. Other transistor features, such as source/drain regions to either side of a given gate structure, channel region (area of fin underneath a gate structure), trench-based source/drain contacts, trench-based gate contact, interlayer dielectric or insulator fill, are not shown, but will be apparent.

A self-aligned gate edge isolation structure including a self-aligned gate edge liner 107, a self-aligned gate edge cap 108, and a self-aligned gate edge body 109 laterally separates adjacent gate structures 106, the self-aligned gate edge isolation components centered between adjacent groupings of semiconductor fins 104. A portion of a second self-aligned gate edge isolation structure is also shown in FIG. 1. The self-aligned gate edge isolation structure components 107, 108, and 109 may be composed of a material or materials suitable to electrically isolate, or contribute to the isolation of, at least portions of neighboring permanent gate structures from one another. Example materials or material combinations include a single material structure such as silicon dioxide, silicon oxy-nitride, silicon nitride, or carbon-doped silicon nitride. Other example materials or material combinations include a multi-layer stack having a lower portion silicon dioxide, silicon oxy-nitride, silicon nitride, or carbon-doped silicon nitride and an upper portion higher dielectric constant material such as hafnium oxide. Other examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In a specific example case, the self-aligned gate edge liner 107 is composed of silicon nitride, the self-aligned gate edge cap 108 is composed of hafnium oxide, and the self-aligned gate edge body 109 is composed of silicon dioxide.

Local conductive interconnects 110 may be formed above the gate electrodes 106 and, in some cases, over one or more of the self-aligned gate edge isolation structures 107, 108, and 109. In some implementations, local interconnects 110 may be formed using titanium nitride (TiN) or tungsten (W), although any number of suitable conductors can be used. A dielectric capping layer 112 is formed over the local interconnects 110, as is depicted. Examples of suitable dielectric materials include, but are not limited to, oxides of silicon (e.g., silicon dioxide ($SiO_2$)), doped oxides of silicon, fluorinated oxides of silicon, carbon doped oxides of silicon, nitrides (e.g., silicon nitride (SiN)), low-k dielectric materials (e.g., polymers, porous $SiO_2$), and combinations thereof.

Resistor Between Gates in Self-Aligned Gate Edge Isolation Structures

Figure 2A:
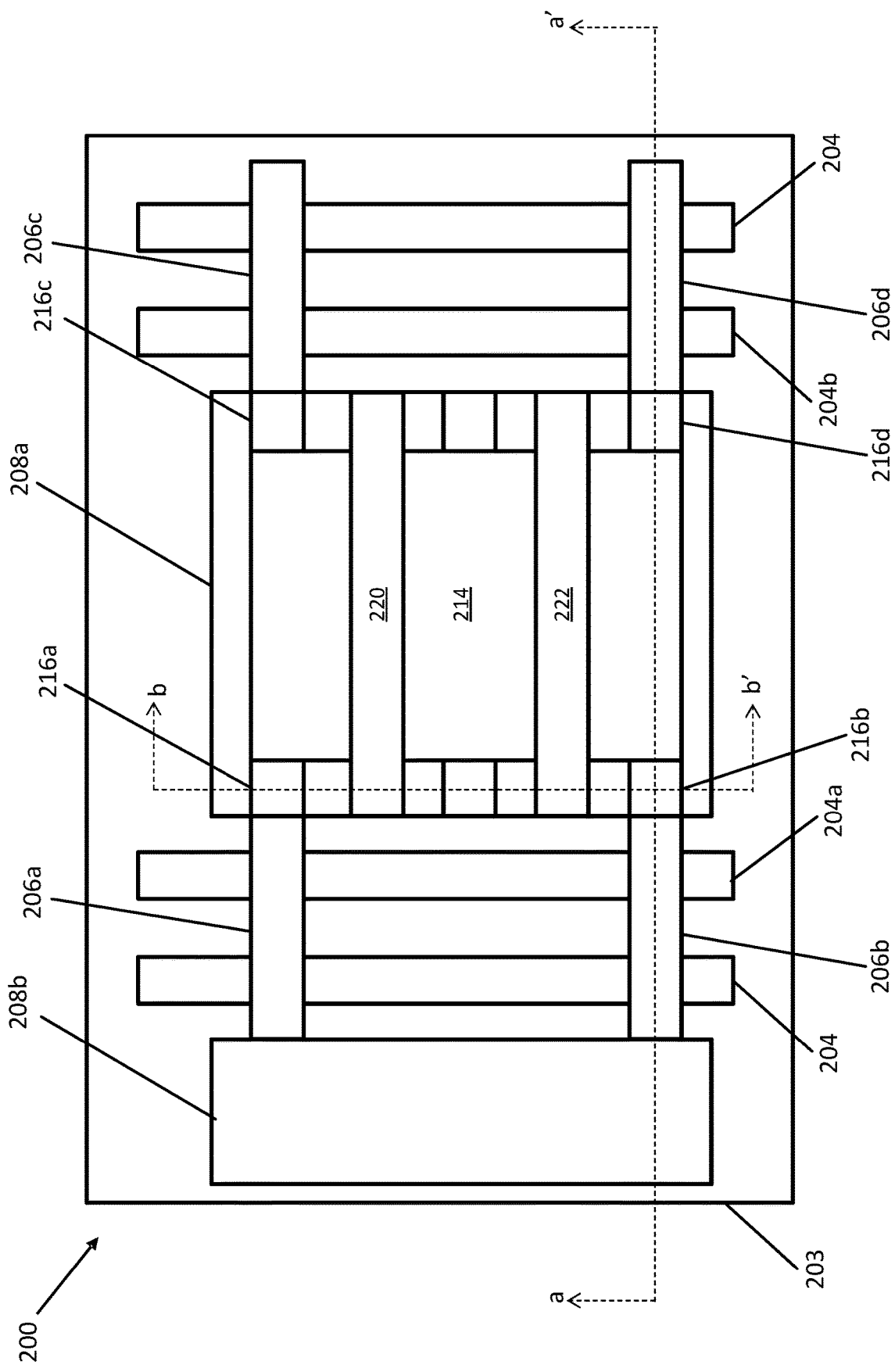
FIG. 2A illustrates a plan view of a semiconductor structure including a resistor between gates in a SELF-ALIGNED GATE EDGE isolation structure according to an embodiment of this disclosure.
Figure 2B:
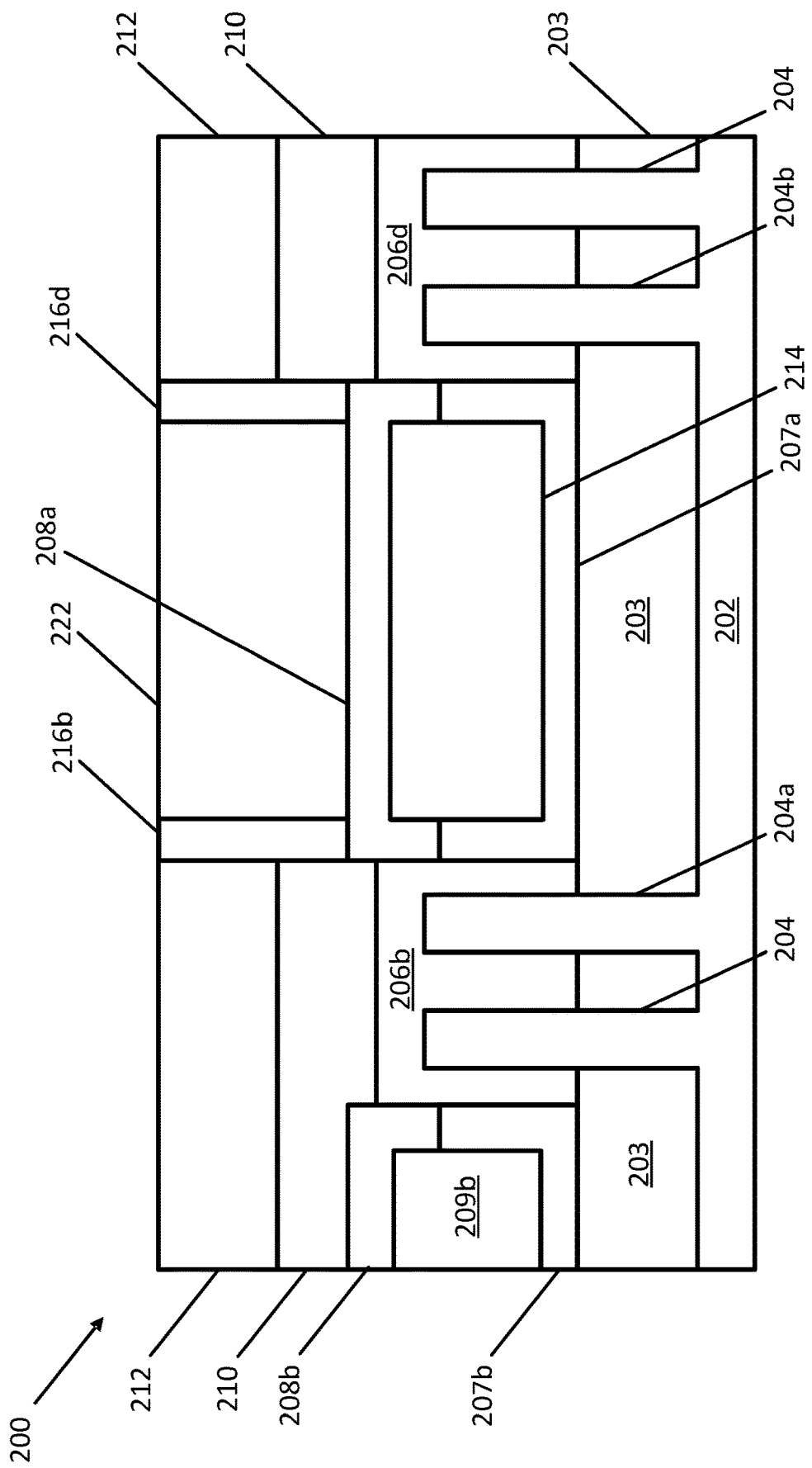
FIG. 2B illustrates a cross-sectional view taken along the a-a' axis of the structure of FIG. 2A according to an embodiment of this disclosure.

In an embodiment according to this disclosure, shown in plan view in FIG. 2A and in cross sectional view in FIG. 2B, a semiconductor structure 200 includes a self-aligned gate edge isolation structure wherein the self-aligned gate edge body 209 has been replaced with a resistor 214. As shown in FIG. 2B, the semiconductor structure 200 includes a plurality of semiconductor fins 204 continuous with and protruding from the substrate 202, through an insulator layer 203. In other embodiments, some or all of the fins 204 may be distinct (formed from different material) from the substrate 202. Turning to FIG. 2A, a first semiconductor fin 204a is shown extending in a first direction, and a second semiconductor fin 204b is shown adjacent to the first semiconductor fin 204a and extending in the first direction. A first gate structure 206a, which may include a gate electrode and gate dielectric layer, is proximal to a first end of the first semiconductor fin 204a and over the first semiconductor fin 204a in a second direction, the first gate structure 206a orthogonal to the first direction. A second gate structure 206b, which may include a gate electrode and gate dielectric layer, is proximal to a second end of the first semiconductor fin 204a and over the first semiconductor fin 204a in the second direction. As can be further seen in FIG. 2A, third gate structure 206c, which may include a gate electrode and gate dielectric layer, is proximal to a first end of the second semiconductor fin 204b and over the second semiconductor fin 204b in the second direction. A fourth gate structure 206d, which may include a gate electrode and gate dielectric layer, is proximal to a second end of the second semiconductor fin 204b and over the second semiconductor fin 204b in the second direction. A first structure comprising a self-aligned gate edge cap 208a and self-aligned gate edge liner 207a (shown in FIG. 2B) comprising isolation material laterally separate adjacent gate structures 206a and 206c (as well as adjacent gate structures 206b and 206d). Further note, in this example embodiment, that the self-aligned gate edge cap 208a and self-aligned gate edge liner 207a are generally centered between adjacent semiconductor fins 204a and 204b. A portion of a second self-aligned gate edge cap 208b is also shown in FIG. 2A. The previous relevant discussion with respect to the substrate 102, insulator layer 103, fins 104, gate structure 106, and self-aligned gate edge components 107, 108, and 109, is equally applicable here as will be appreciated, and not all details and variations are repeated for sake of brevity.

A second structure comprising a resistor 214 comprising resistive material is disposed in the self-aligned gate edge isolation (first) structure in place of the self-aligned gate edge body 209. The second structure 214 being disposed in the first structure includes having the second structure at least partially enclosed within the first structure (e.g., having only the bottom and sides of the second structure enclosed by the self-aligned gate edge liner 207a and self-aligned gate edge cap 208a, but at least a portion of the second structure not enclosed by the self-aligned gate edge cap 208a), and having the second structure fully enclosed within the first structure (e.g., having the top, bottom, and all sides of the second structure enclosed within the first structure). As can be best seen in FIG. 2A, the resistor 214 extends at least between the first gate structure 206a and the second gate structure 206b. Further note that the resistor 214 is electrically isolated from the first and second gate structures 206a and 206b. The resistor 214 may be composed of, for example, polysilicon, titanium nitride (TiN) or tungsten (W), or any other material suitable to provide a resistor which in some embodiments is a precision resistor having low variation in resistivity and a near-zero temperature coefficient, in that the resistivity of the resistor 214 does not change significantly over a range of operating temperatures of the resistor 214. In some embodiments, the resistor 214 has an electrical resistivity in a range of between 1 ohm/sq and 1,000 ohms/sq, although any number of suitable resistivities per square can be configured, depending on the resistive material(s) used. The dimensions of the resistor 214 can be set in conjunction with the resistivity/square rating to provide a desired resistance. For a resistor 214 composed of polysilicon, a desired resistivity/square rating can be achieved by doping the polysilicon with a dopant, such as boron, at a concentration in a range of between $1E15$ $cm^{-3}$ and $1E17$ $cm^{-3}$. In certain embodiments, the resistor 214 has a lateral thickness (between the adjacent gate structures 206a and 206c) in a range of between 500 nm and 15 microns, and a height (between the bottom of self-aligned gate edge liner 207a and underside of self-aligned gate edge cap 208a) in a range of 10 nm to 1 micron, although the thickness and height can vary from one embodiment to the next as will be appreciated, depending on factors such as desired resistance and available space for the resistor 214 to occupy. To this end, the present disclosure is not intended to be limited to any particular range of resistivities or resistor dimensions.

As shown in FIG. 2A, the resistor 214 extends under the self-aligned gate edge cap 208a, spanning the area between the gate structures 206a, 206b, 206c, and 206d. In one embodiment, the resistor 214 is electrically isolated from the gate structures 206a, 206b, 206c, and 206d by dielectric plugs 216a, 216b, 216c, and 216d, respectively. Examples of suitable dielectric materials include, but are not limited to, oxides of silicon (e.g., $SiO_2$), doped oxides of silicon, fluorinated oxides of silicon, carbon doped oxides of silicon, various low-k dielectric materials known in the arts (e.g., porous $SiO_2$), and combinations thereof. Further note that the resistor 214 is electrically isolated from the gate structures 206a, 206b, 206c, and 206d by the self-aligned gate edge liner 207a (shown in FIG. 2B) and the self-aligned gate edge cap 208a. The self-aligned gate edge liner 207a and self-aligned gate edge cap 208a can be composed of materials such as those previously discussed with respect to self-aligned gate edge liner 107 and self-aligned gate edge cap 108.

As also shown in FIG. 2A, the resistor 214 is electrically connected by a first contact 220, also referred to as an anode, on a first location of the resistor 214, and a second contact 222, also referred to as a cathode, on a second location of the resistor 214. The contacts 220 and 222 are formed of a conductive material, such as a metal species. The metal species may be a pure metal, such as tungsten, nickel, or cobalt, or may be an alloy such as a metal-metal alloy or a metal-semiconductor alloy (e.g., such as a silicide material). One example is the use of copper structures that may or may not include barrier layers (such as Ta or TaN layers) between the copper and surrounding interlayer dielectric (ILD) material. As used herein, the term metal includes alloys, stacks, and other combinations of multiple metals. In a more general sense, the contacts 220 and 222 may be a multi-component structure having one or more barrier layers, liners, work function layers, in addition to a plug portion, and the present disclosure is not intended to be limited to any particular contact structure.

FIG. 2B illustrates a cross-sectional view taken along the a-a' axis of the structure of FIG. 2A, showing, in addition to the elements shown in FIG. 2A, a self-aligned gate edge liner 207a under the resistor 214. The cathode 222 (and anode 220) contacts the resistor 214 through an opening (not shown) in the self-aligned gate edge cap 208a. The substrate 202, local interconnects 210 and dielectric capping layer 212 are also shown in FIG. 2B. The previous relevant discussion with respect to the substrate 102, local interconnects 110, and dielectric capping layer 112 is equally applicable here as will be appreciated, and not all details and variations are repeated for sake of brevity.

Methodology and Architecture

Figure 3:
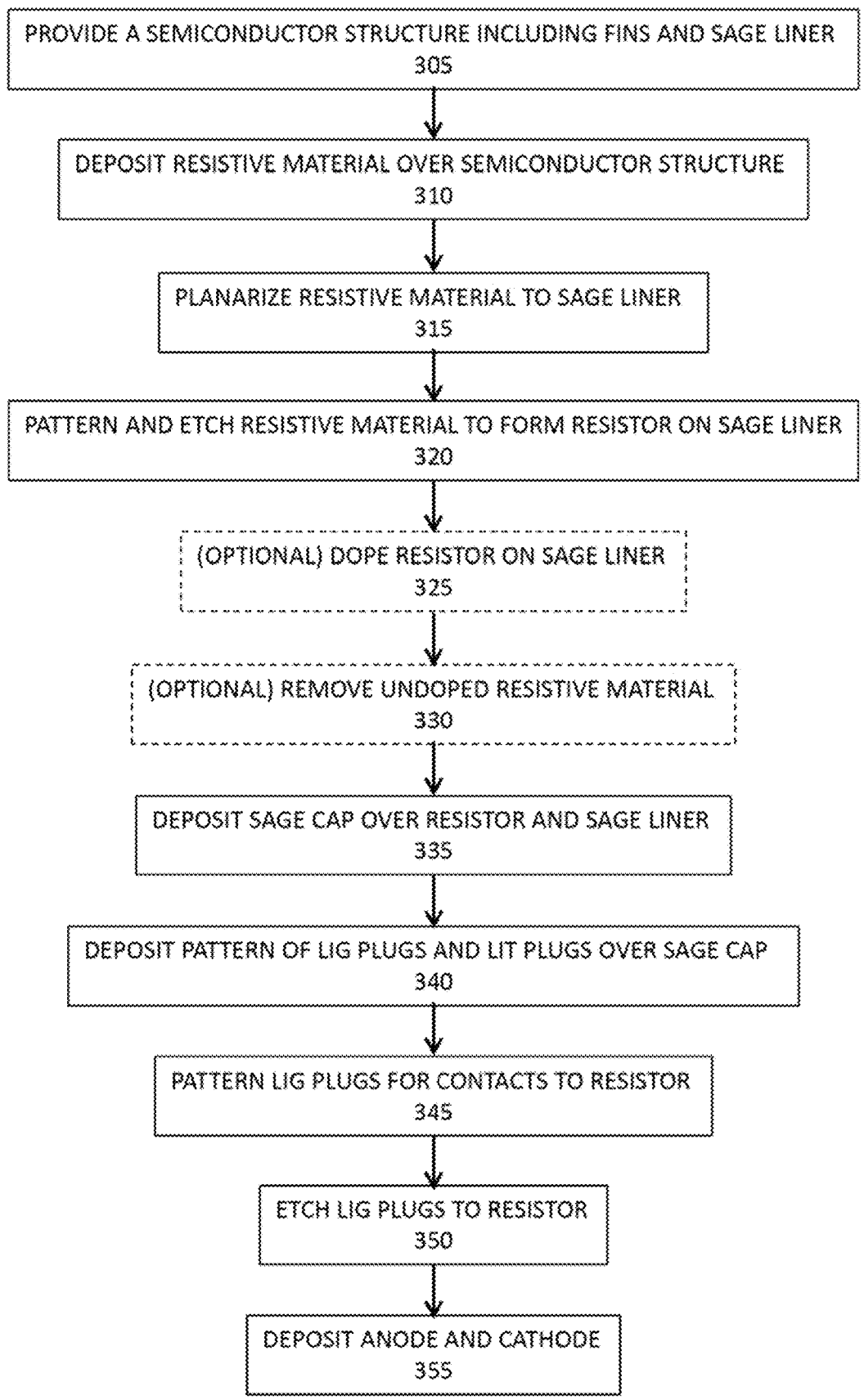
FIG. 3 is a method for forming a semiconductor structure including a resistor between gates in self-aligned gate edge architecture according to an embodiment of this disclosure.

FIG. 3 is a method for forming a semiconductor structure including a resistor between gates in self-aligned gate edge architecture in accordance with an embodiment of the present disclosure. FIGS. 4A through 4I illustrate example structures that are formed as the method is carried out, and in accordance with some embodiments.

Figure 4A:
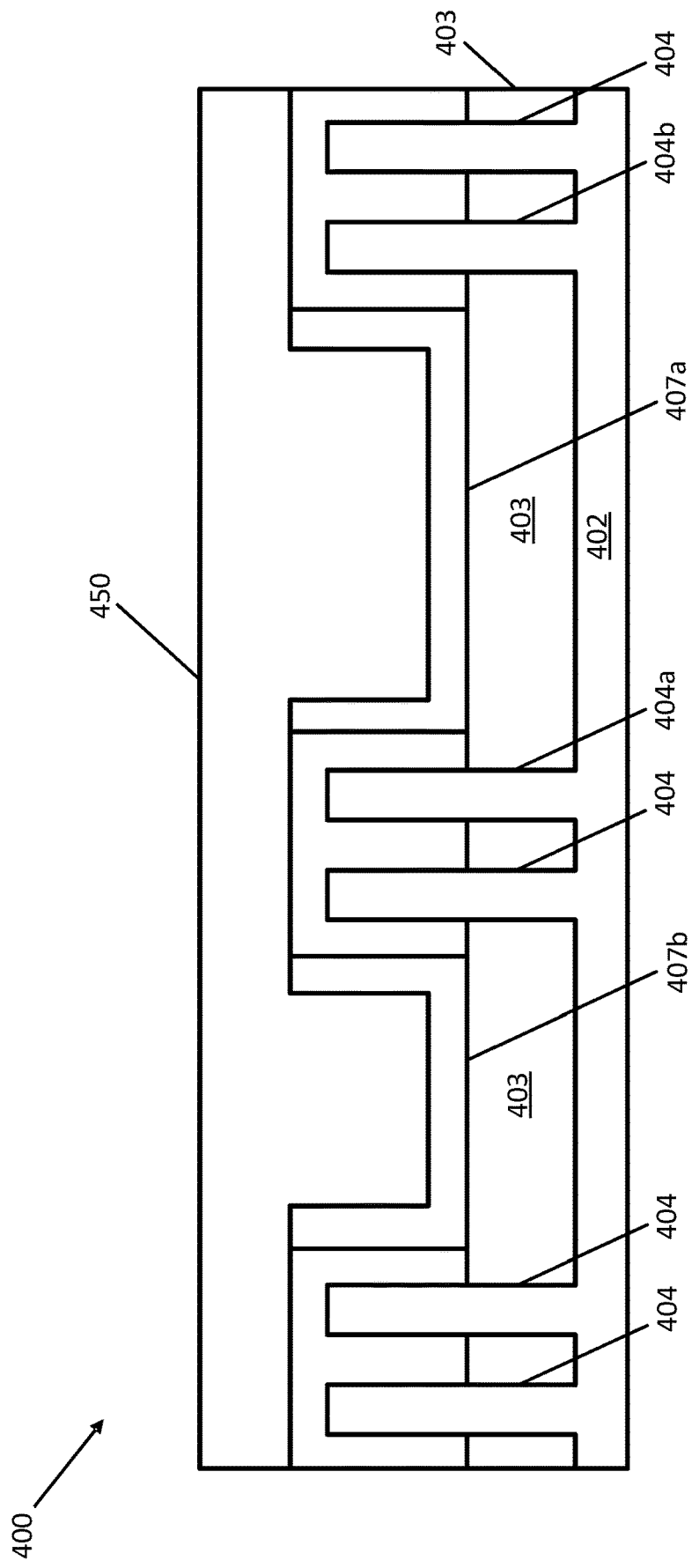

As can be seen, the method includes providing 305 a semiconductor structure including fins and a self-aligned gate edge liner upon which a resistor may be formed between gates in self-aligned gate edge architecture. As can be seen, FIG. 4A illustrates a semiconductor structure 400 including fins 404 and a self-aligned gate edge liner 407a. Two groupings of fins 404, including adjacent fins 404a and 404b, with the self-aligned gate edge liner 407a centered between them, are shown in FIG. 4A. The semiconductor fins 404 are continuous with and protrude from the substrate 402, through an insulator layer 403, in this example embodiment. In other embodiments, at least some of the fins may be so-called replacement fins, such that those fins are composed of a semiconductor material different from the substrate (such as silicon germanium fins formed on a silicon substrate). In a more general sense, the fins can be native to the substrate or replacement fins or any combination of native and replacement fins. A portion of a second self-aligned gate edge liner 407b is also shown in FIG. 4A. The previous relevant discussion with respect to the substrate 102, insulator layer 103, fins 104, and self-aligned gate edge liner 107, is equally applicable here as will be appreciated, and not all details and variations are repeated for sake of brevity.

With further reference to FIG. 3, the method further includes depositing 310 a resistive material 450 over the semiconductor structure 400, as shown in FIG. 4A. Suitable resistive materials include polysilicon, titanium nitride (TiN) or tungsten (W), or any other material suitable to form a resistor. The previous relevant discussion with respect to the resistor 214 is equally applicable here as will be appreciated, and not all details and variations are repeated for sake of brevity. The resistive material layer 450 may be formed by chemical vapor deposition (CVD), physical vapor deposition (PVD), or by other deposition methods.

Figure 4B:
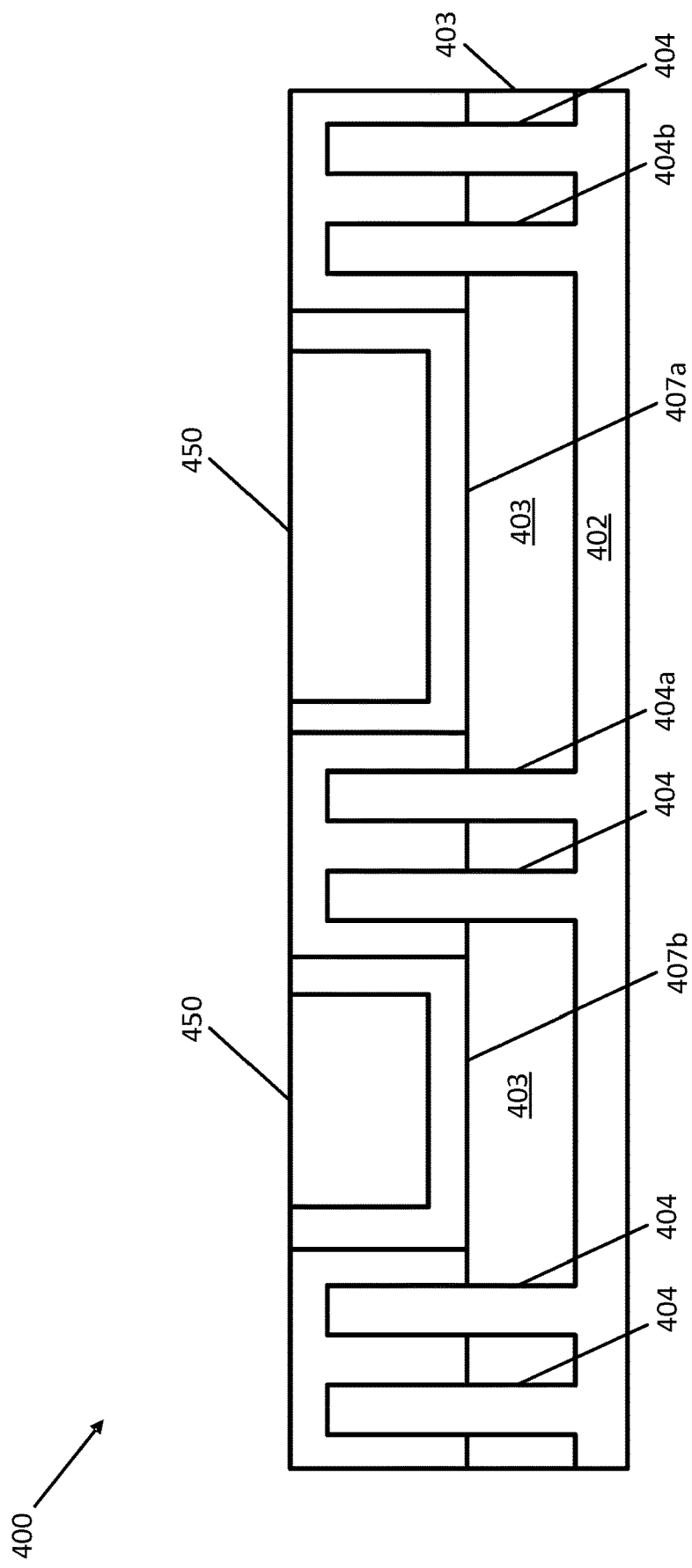
Figure 4C:
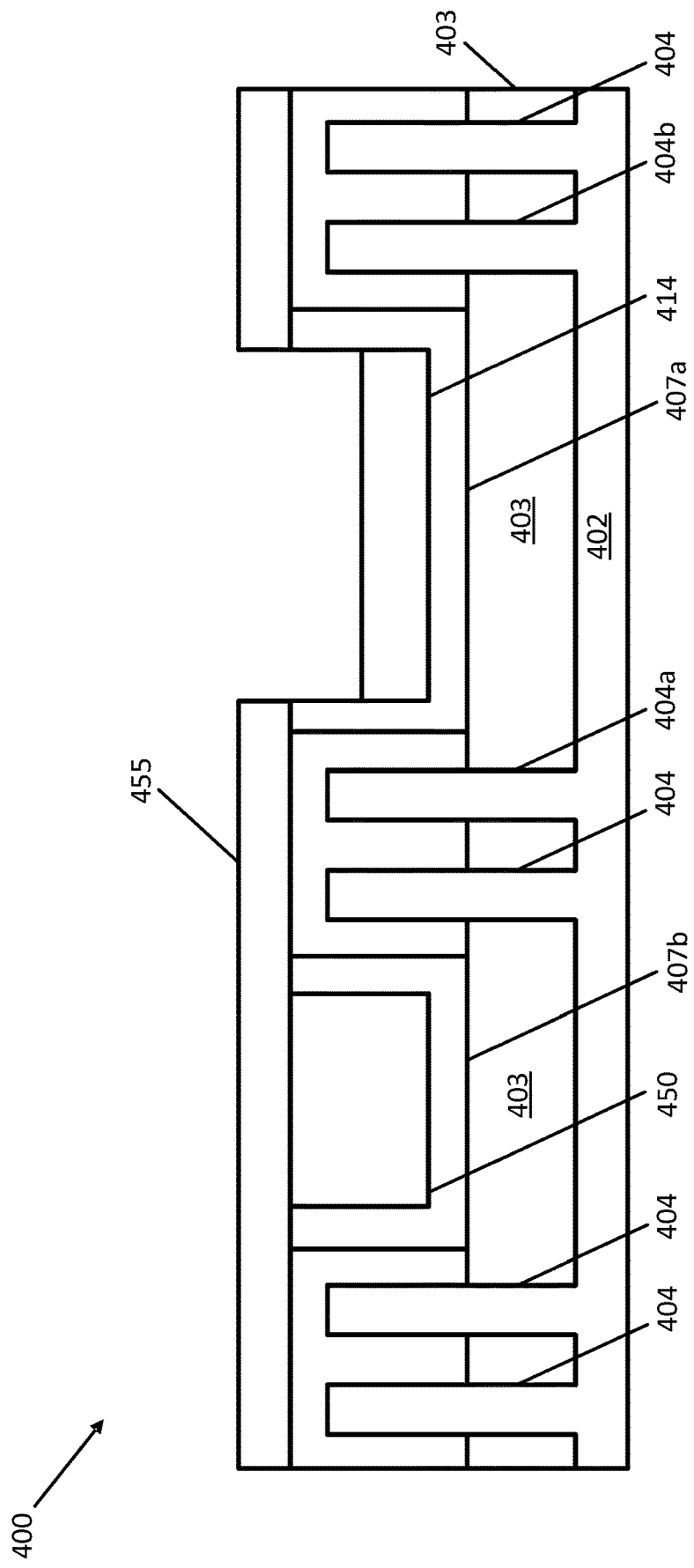

With further reference to FIG. 3, the method further includes planarizing 315 the deposited resistive material 450 by, for example, chemical mechanical polishing/planarizing (CMP), stopping on exposure of the self-aligned gate edge liner 407a, as shown in FIG. 4B. With further reference to FIG. 3, the method further includes patterning and etching 320 the resistive material 450 to form resistor 414 in self-aligned gate edge liner 407a, as shown in FIG. 4C. The resistive material 450 can be patterned using any suitable techniques, such as one or more lithography and etch processes, for example, to etch the resistive material 450 in the self-aligned gate edge liner 407a.

Figure 4D:
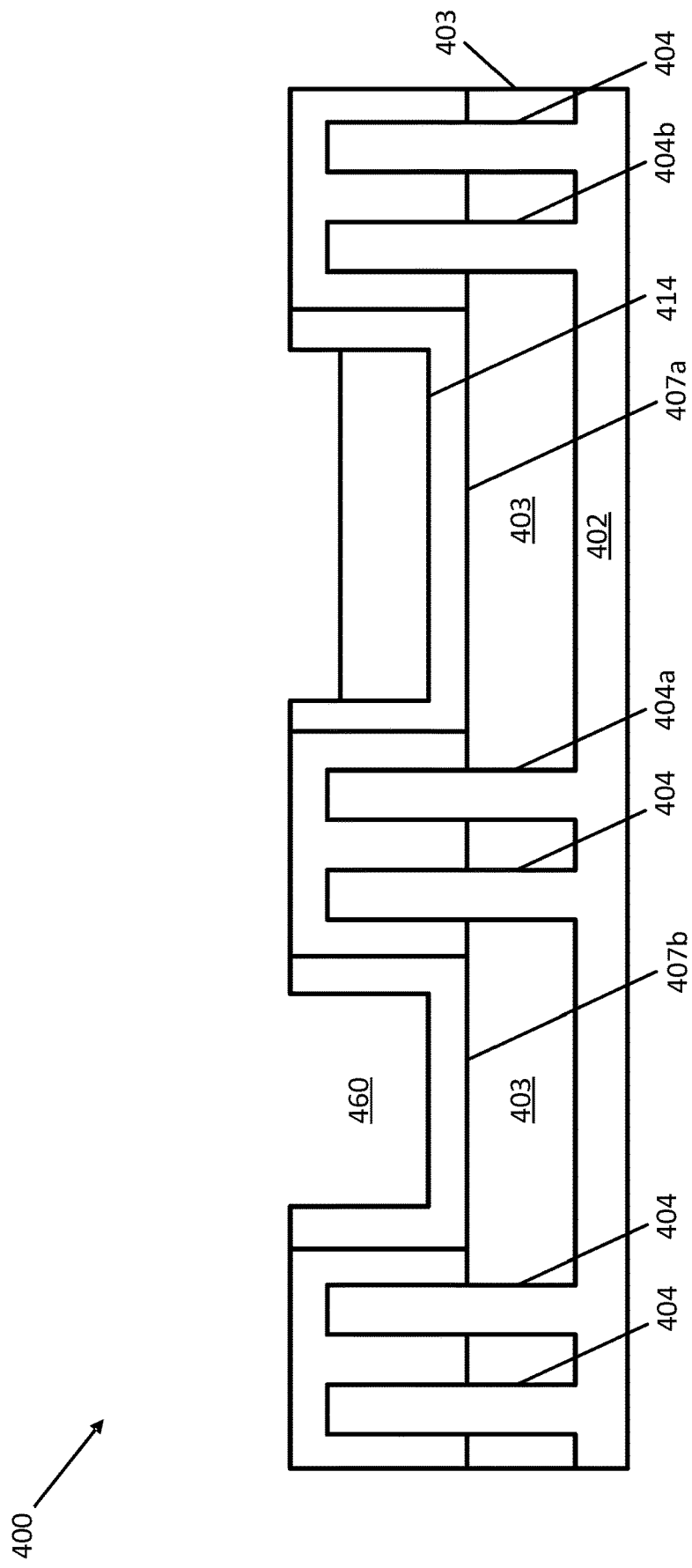

With further reference to FIG. 3, if the resistive material 450 is polysilicon, then the method optionally further includes doping 325 the resistor 414 with a dopant, such as boron, at a concentration in a range of between $1E15$ $cm^{-3}$ and $1E17$ $cm^{-3}$. A standard ion implantation process at an energy in a range of between 5 keV and 10 keV can be used to dope the resistor 414. After removal of the mask 455, by, for example, a standard polymer removal process, the method further includes removing 330 undoped resistive material 450, leaving behind a cavity 460 for the self-aligned gate edge body, as shown in FIG. 4D, by, for example, a wet cleaning process using tetramethylammonium hydroxide (TMAH), which etches undoped polysilicon selectively over doped polysilicon.

Figure 4E:
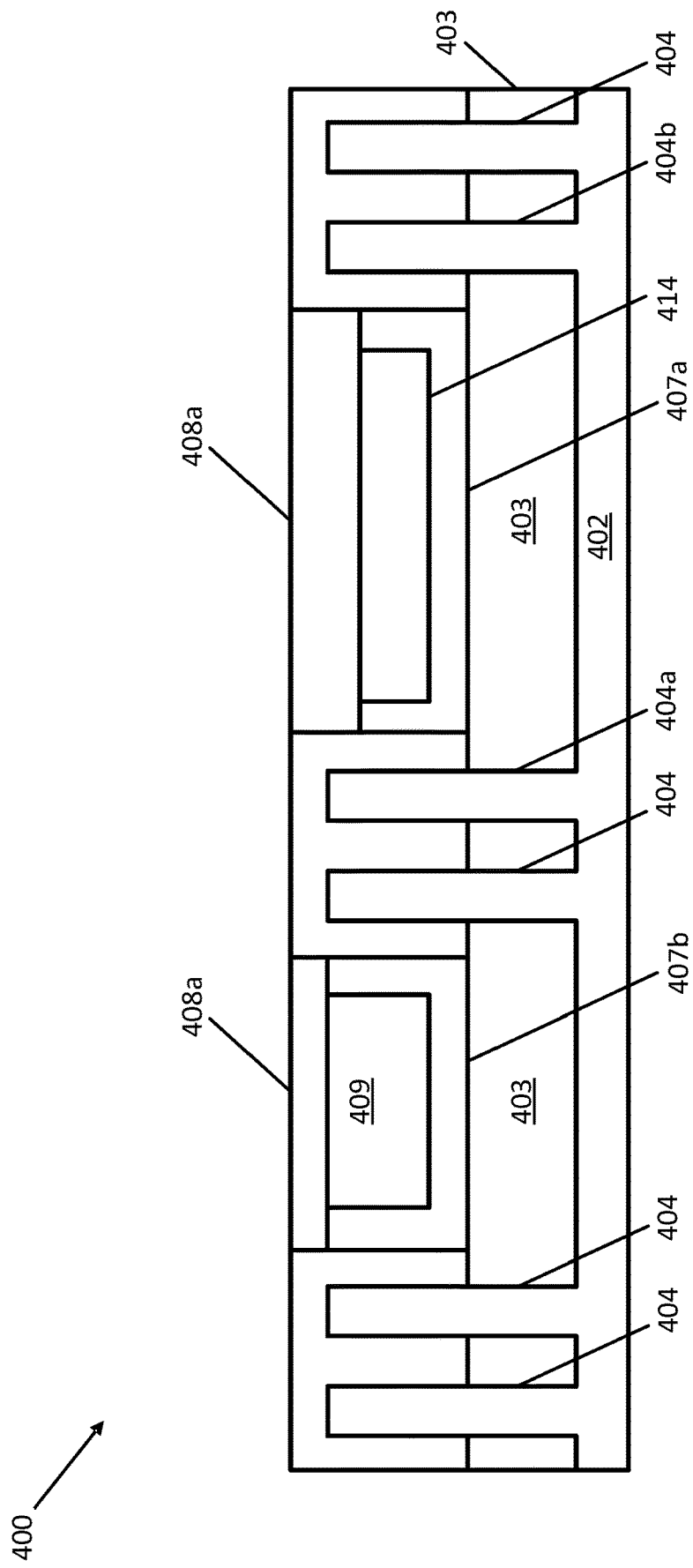

With further reference to FIG. 3, the method further includes depositing 335 the self-aligned gate edge cap 408a over resistor 414 and self-aligned gate edge liner 407a, as shown in FIG. 4E. The previous relevant discussion with respect to the self-aligned gate edge cap 108 is equally applicable here as will be appreciated, and not all details and variations are repeated for sake of brevity. The self-aligned gate edge cap 408a may be formed by CVD, PVD, or by other deposition methods.

With further reference to FIG. 3, the method further includes depositing 340 a pattern of local-interconnect-to-trench (LIT) plugs and local-interconnect-to-gate (LIG) plugs over the self-aligned gate edge cap. FIGS. 4F to 4I illustrate cross-sectional views taken along the b-b' axis of the structure of FIG. 2A, thereby showing the formation of the anode and cathode as described further below. LIT plugs 470 and LIG plugs 475 can be patterned using any suitable techniques, such as one or more lithography and etch processes, to provide a pattern wherein the LIT plugs 470 are deposited over the self-aligned gate edge cap 408a at the ends of the resistor 414, and LIG plugs 475 alternate with LIT plugs 470 over the self-aligned gate edge cap 411, as shown in FIG. 4F. LIT plugs 470 and LIG plugs 475 are both formed of insulator materials, with LIG plugs 475 formed of a different insulator material than LIT plugs 470. Example materials or material combinations for the LIT plugs 470 and LIG plugs 475 include a single material structure such as silicon dioxide, silicon oxy-nitride, silicon nitride, or carbon-doped silicon nitride. Other example materials or material combinations include a multi-layer stack having a lower portion silicon dioxide, silicon oxy-nitride, silicon nitride, or carbon-doped silicon nitride and an upper portion higher dielectric constant material such as hafnium oxide. In an example embodiment, LIG plugs 475 are formed of silicon nitride, and LIT plugs 470 are formed of silicon dioxide.

With further reference to FIG. 3, the method further includes patterning 345 the LIG plugs for contacts to the resistor 414, as shown in FIG. 4G, using any suitable techniques, such as one or more lithography processes. With further reference to FIG. 3, the method further includes etching 350 the LIG plugs 475 to the resistor, as shown in FIG. 4H. As can be seen, the LIG plugs 475 and the portion of the self-aligned gate edge cap 408a under the LIG plugs 475 have been etched away to expose the portion of resistor 414 underneath the LIG plugs 475. Any wet and/or dry etching process suitable for etching the LIG plug and self-aligned gate edge cap materials can be used.

Figure 4I:
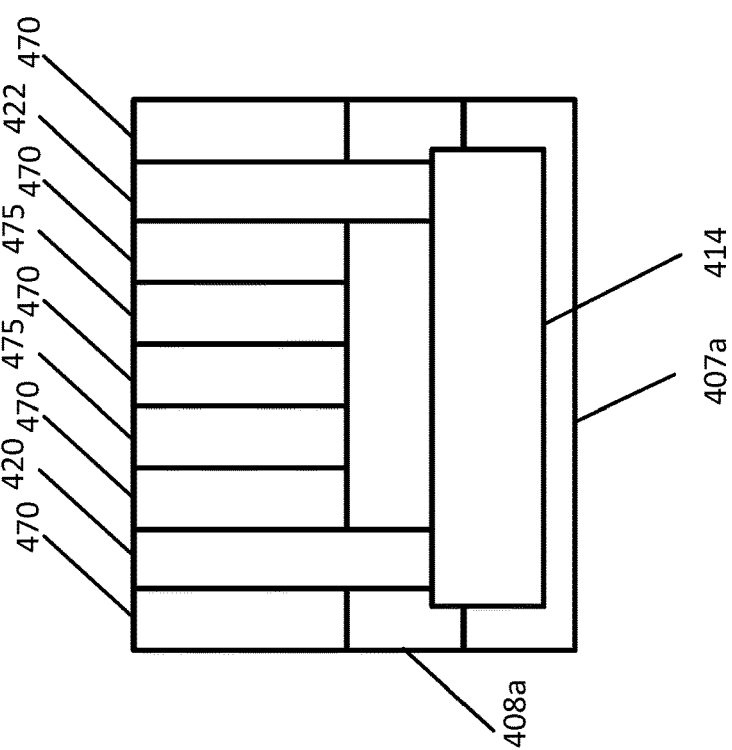

With further reference to FIG. 3, the method further includes depositing 355 a first contact, also referred to as an anode, on a first location of the resistor, and a second contact, also referred to as a cathode, on a second location of the resistor, as shown in FIG. 4I. As can be seen, anode 420 is deposited between adjacent LIT plugs 470 on a first location of the resistor 414, and cathode 422 is deposited between LIT plugs 470 on a second location of the resistor 414. The previous relevant discussion with respect to the contacts 220 and 222 is equally applicable here as will be appreciated, and not all details and variations are repeated for sake of brevity.

Figure 5:
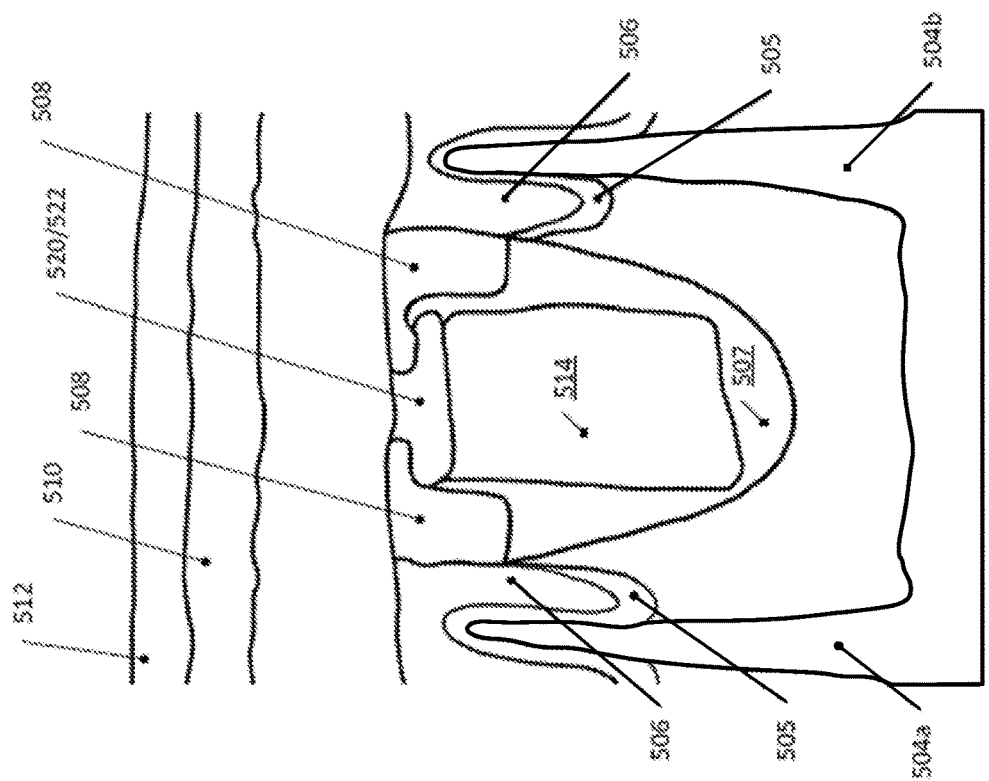
FIG. 5 illustrates a semiconductor structure including a resistor between gates in self-aligned gate edge architecture according to an embodiment of this disclosure.

FIG. 5 illustrates a semiconductor structure including a resistor between gates in self-aligned gate edge architecture according to an embodiment of this disclosure. As can be seen, in comparison to FIG. 2B, as-built shapes of the semiconductor fins 504a and 504b, are tapered. Resistor 514, contacts 520/522, local conductive interconnects 510, and dielectric capping layer 512 also show as-built shapes. The previous discussion relevant to semiconductor fins 204a, and 204b, resistor 214, contacts 220/222, local conductive interconnects 210, and dielectric capping layer 212 is equally applicable here as will be appreciated. FIG. 5 also illustrates gate structures (gate electrode 506 and gate dielectric 505), and components of the self-aligned gate edge structure, including self-aligned gate edge cap 508 and self-aligned gate edge liner 507. The previous discussion relevant to gate structures 206, self-aligned gate edge cap 208, and self-aligned gate edge liner 207 is equally applicable here as will be appreciated.

Use of the techniques and structures provided herein may be detectable using tools such as: electron microscopy including scanning/transmission electron microscopy (SEM/TEM), scanning transmission electron microscopy (STEM), and reflection electron microscopy (REM); composition mapping; x-ray crystallography or diffraction (XRD); energy-dispersive x-ray spectroscopy (EDS); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may indicate the presence of resistors between gates in self-aligned gate edge architecture in a semiconductor integrated circuit, as variously described herein.

Example System

Figure 6:
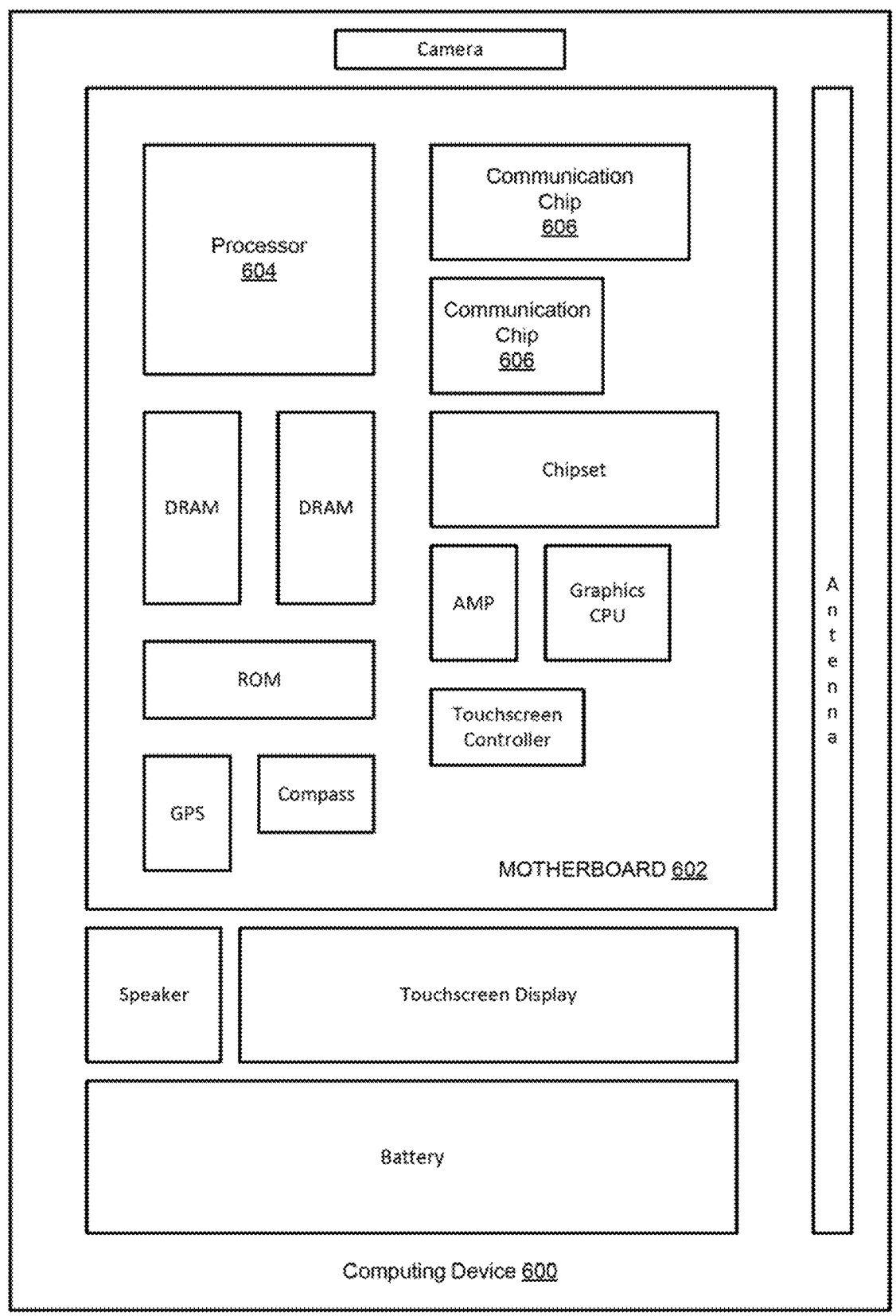
FIG. 6 is a depiction of a computing system configured according to an embodiment of this disclosure.

FIG. 6 is an example computing system implemented with one or more of the integrated circuit structures as disclosed herein, in accordance with some embodiments of the present disclosure. As can be seen, the computing system 600 houses a motherboard 602. The motherboard 602 may include a number of components, including, but not limited to, a processor 604 and at least one communication chip 606, each of which can be physically and electrically coupled to the motherboard 602, or otherwise integrated therein. As will be appreciated, the motherboard 602 may be, for example, any printed circuit board, whether a main board, a daughterboard mounted on a main board, or the only board of system 600, etc.

Depending on its applications, computing system 600 may include one or more other components that may or may not be physically and electrically coupled to the motherboard 602. These other components may include, but are not limited to, volatile memory (e.g., DRAM), non-volatile memory (e.g., read only memory (ROM)), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 600 may include one or more integrated circuit structures or devices configured in accordance with an example embodiment (e.g., to include one or more semiconductor structures including a resistor between gates in self-aligned gate edge architecture, as variously provided herein). In some embodiments, multiple functions can be integrated into one or more chips (e.g., for instance, note that the communication chip 606 can be part of or otherwise integrated into the processor 604).

The communication chip 606 enables wireless communications for the transfer of data to and from the computing system 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including, but not limited to, Wi-Fi (Institute of Electrical and Electronics Engineers (IEEE) 802.11 family), worldwide interoperability for microwave access (WiMAX) (IEEE 802.16 family), IEEE 802.20, long term evolution (LTE), 1× evolution-data optimized (Ev-DO), high speed packet access (HSPA+), high speed downlink packet access (HSDPA+), high speed uplink packet access (HSUPA+), enhanced data rates for GSM evolution (EDGE), global system for mobile communication (GSM), general packet radio service (GPRS), code division multiple access (CDMA), time division multiple access (TDMA), digital enhanced cordless telecommunications (DECT), Bluetooth, derivatives thereof, as well as any other wireless protocols that are designated as 3G, 4G, 5G, and beyond. The computing system 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others. In some embodiments, communication chip 606 may include one or more semiconductor structures including a resistor between gates in self-aligned gate edge architecture as variously described herein.

The processor 604 of the computing system 600 includes an integrated circuit die packaged within the processor 604. In some embodiments, the integrated circuit die of the processor includes onboard circuitry that is implemented with one or more integrated circuit structures or devices as variously described herein. The term "processor" may refer to any device or portion of a device that processes, for instance, electronic data from registers and/or memory to transform that electronic data into other electronic data that may be stored in registers and/or memory.

The communication chip 606 also may include an integrated circuit die packaged within the communication chip 606. In accordance with some such example embodiments, the integrated circuit die of the communication chip includes one or more integrated circuit structures or devices as variously described herein. As will be appreciated in light of this disclosure, note that multi-standard wireless capability may be integrated directly into the processor 604 (e.g., where functionality of any chips 606 is integrated into processor 604, rather than having separate communication chips). Further note that processor 604 may be a chip set having such wireless capability. In short, any number of processor 604 and/or communication chips 606 can be used. Likewise, any one chip or chip set can have multiple functions integrated therein.

In various implementations, the computing system 600 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

FURTHER EXAMPLE EMBODIMENTS

The following examples pertain to further embodiments, from which numerous permutations and configurations will be apparent.

Example 1 is a semiconductor structure, comprising: a first semiconductor fin extending in a first direction; a second semiconductor fin adjacent to the first semiconductor fin and extending in the first direction; a first gate structure proximal to a first end of the first semiconductor fin and over the first semiconductor fin in a second direction, the first gate structure orthogonal to the first direction; a second gate structure proximal to a second end of the first semiconductor fin and over the first semiconductor fin in the second direction; a first structure centered between the first and second semiconductor fins, the first structure comprising isolation material; and a second structure in the first structure, the second structure extending at least between the first gate structure and the second gate structure and comprising resistive material, the second structure being electrically isolated from the first and second gate structures.

Example 2 includes the subject matter of Example 1, wherein the second structure includes at least one of polysilicon, titanium nitride (TiN), and tungsten (W).

Example 3 includes the subject matter of Example 1 or Example 2, wherein the second structure has an electrical resistivity in a range of between 1 ohm/sq and 1,000 ohms/sq.

Example 4 includes the subject matter of any of Examples 1 to 3, wherein the first and second gate structures both include a gate dielectric and a gate electrode.

Example 5 includes the subject matter of any of Examples 1 to 4, further comprising a first contact on a first location of the second structure, and a second contact on a second location of the second structure.

Example 6 includes the subject matter of any of Examples 1 to 5, wherein the first structure includes a self-aligned gate edge isolation structure.

Example 7 includes the subject matter of any of Examples 1 to 6, wherein the second structure includes a precision resistor.

Example 8 includes the subject matter of Example 7, wherein the precision resistor has a thickness between the first gate structure and the second gate structure in a range of between 1 micron and 15 microns.

Example 9 includes the subject matter of any of Examples 1 to 8, wherein the second structure is at least partially enclosed within the first structure.

Example 10 includes the subject matter of any of Examples 1 to 9, wherein the second structure is electrically isolated from the first and second gate structures at least in part by dielectric plugs.

Example 11 includes a method for forming a semiconductor structure, the method comprising: forming a first semiconductor fin in a first direction; forming a second semiconductor fin adjacent to the first semiconductor fin in the first direction; forming a first gate structure proximal to a first end of the first semiconductor fin and over the first semiconductor fin in a second direction, the first gate structure orthogonal to the first direction; forming a second gate structure proximal to a second end of the first semiconductor fin and over the first semiconductor fin in the second direction; forming a first structure centered between the first and second semiconductor fins, the first structure comprising isolation material; and forming a second structure in the first structure, the second structure extending at least between the first gate structure and the second gate structure and comprising resistive material, the second structure being electrically isolated from the first and second gate structures.

Example 12 includes the subject matter of Example 11, wherein the second structure includes at least one of titanium nitride (TiN) and tungsten (W).

Example 13 includes the subject matter of either of Examples 11 or 12, wherein the second structure has an electrical resistivity in a range of between 1 ohm/sq and 1,000 ohms/sq.

Example 14 includes the subject matter of any of Examples 11 to 13, wherein the first and second gate structures both include a gate dielectric and a gate electrode.

Example 15 includes the subject matter of any of Examples 11 to 14, further including forming a first contact on a first location of the second structure, and forming a second contact on a second location of the second structure.

Example 16 includes the subject matter of any of Examples 11 to 15, wherein forming the first structure includes forming a self-aligned gate edge isolation structure.

Example 17 includes the subject matter of any of Examples 11 to 16, wherein forming the second structure includes forming a precision resistor.

Example 18 includes the subject matter of any of Examples 11 to 17, further including at least partially enclosing the second structure within the first structure.

Example 19 includes the subject matter of any of Examples 11 to 18, further including forming dielectric plugs that electrically isolate the second structure from the first and second gate structures.

Example 20 includes a semiconductor structure, comprising: a first group of semiconductor fins extending in a first direction; a second group of semiconductor fins adjacent to the first semiconductor fin and extending in the first direction; a first gate structure proximal to a first end of the first group of semiconductor fins and over the first group of semiconductor fins in a second direction, the first gate structure orthogonal to the first direction; a second gate structure proximal to a second end of the first group of semiconductor fins and over the first group of semiconductor fins in the second direction; a third gate structure proximal to a first end of the second group of semiconductor fins and over the second group of semiconductor fins in the second direction, the first gate structure orthogonal to the first direction; a fourth gate structure proximal to a second end of the second group of semiconductor fins and over the second group of semiconductor fins in the second direction; a first structure centered between the first and second groups of semiconductor fins, the first structure comprising isolation material; and a second structure on the first structure, the second structure spanning an area between the first, second, third, and fourth gate structures and comprising resistive material, the second structure being electrically isolated from the first and second gate structures at least in part by dielectric plugs, and being electrically connected by a first contact on a first location of the second structure and a second contact on a second location of the second structure.

Example 21 includes the subject matter of Example 20, further including a local interconnect layer.

Example 22 includes the subject matter of any of Examples 20 or 21, further including a dielectric capping layer.

Example 23 includes the subject matter of any of Examples 20 to 22, wherein the second structure includes at least one of titanium nitride (TiN) and tungsten (W).

Example 24 includes the subject matter of any of Examples 20 to 23, wherein the second structure has an electrical resistivity in a range of between 1 ohm/sq and 1,000 ohms/sq.

Example 25 includes the subject matter of any of Examples 20 to 24, wherein the first, second, third and fourth gate structures each include a gate dielectric and a gate electrode.

Example 26 includes the subject matter of any of Examples 20 to 25, wherein the first structure includes a self-aligned gate edge isolation structure.

Example 27 includes the subject matter of any of Examples 20 to 26, wherein the second structure includes a precision resistor.

Example 28 includes the subject matter of Example 27, wherein the precision resistor has a thickness between the first gate structure and the second gate structure in a range of between 1 micron and 15 microns.

Example 29 includes the subject matter of any of Examples 20 to 28, wherein the second structure is at least partially enclosed within the first structure.

Example 30 includes the subject matter of any of Examples 20 to 29, wherein the first group of semiconductor fins includes two semiconductor fins.

Example 31 includes the subject matter of any of Examples 20 to 30, wherein the second group of semiconductor fins includes two semiconductor fins.

Example 32 includes a computing device that includes the subject matter of any of Examples 1 to 10 and 20 to 31.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor structure, comprising:
    a first fin and a second fin, each comprising semiconductor material;
    a first gate structure over the first fin at a first location;
    a second gate structure spaced from the first gate structure and over the first fin at a second location;
    a first structure between the first and second fins, the first structure comprising isolation material;
    a second structure at least partially in the first structure such that the second structure is both (1) on the isolation material of the first structure and (2) at least partially between the isolation material of the first structure, the second structure extending at least between the first gate structure and the second gate structure and comprising resistive material, the second structure being electrically isolated from the first and second gate structures;
    a first contact on a first location of the second structure; and
    a second contact on a second location of the second structure.

2. The semiconductor structure of claim 1, wherein the second structure includes at least one of polysilicon, titanium nitride (TiN), and tungsten (W).

3. The semiconductor structure of claim 1, wherein the second structure has an electrical resistivity in a range of between 1 ohm/sq and 1,000 ohms/sq.

4. The semiconductor structure of claim 1, wherein the first structure includes a liner portion and a cap portion, the liner portion including the isolation material, and the cap portion includes another isolation material that is different from the isolation material of the liner portion, and wherein the second structure is between the liner portion and the cap portion.

5. The semiconductor structure of claim 1, wherein the second structure includes a precision resistor.

6. The semiconductor structure of claim 5, wherein the precision resistor has a thickness between the first gate structure and the second gate structure in a range of between 1 micron and 15 microns.

7. The semiconductor structure of claim 1, wherein the second structure is fully enclosed within the first structure, and wherein the first and second contacts pass through the first structure.

8. The semiconductor structure of claim 1, wherein the second structure is electrically isolated from the first and second gate structures at least in part by dielectric plugs.

9. The semiconductor structure of claim 1, wherein a sidewall of the first structure abuts a sidewall of one or both of the first gate structure and the second gate structure.

10. A method for forming a semiconductor structure, the method comprising:
    forming a first fin and a second fin, each comprising semiconductor material;
    forming a first gate structure over the first fin at a first location;
    forming a second gate structure spaced from the first gate structure and over the first fin at a second location;
    forming a first structure between the first and second fins, wherein forming the first structure comprises
        forming a liner portion, and
        forming a cap portion,
            wherein the liner portion includes an isolation material, and the cap portion includes another isolation material that is different from the isolation material of the liner portion; and
    forming a second structure at least partially in the first structure such that the second structure is both (1) on the liner portion of the first structure and (2) at least partially between the liner portion of the first structure, the second structure extending at least between the first gate structure and the second gate structure and comprising resistive material, the second structure being electrically isolated from the first and second gate structures, the second structure being between the liner portion and the cap portion of the first structure.

11. The method for forming a semiconductor structure of claim 10, further including forming a first contact on a first location of the second structure, and forming a second contact on a second location of the second structure.

12. The method for forming a semiconductor structure of claim 10, further including at least partially enclosing the second structure within the first structure.

13. A semiconductor structure, comprising:
    a first group of fins and a second group of fins, each of the fins comprising semiconductor material;
    a first gate structure over the first group of fins;
    a second gate structure spaced from the first gate structure and over the first group of fins;
    a third gate structure over the second group of fins;
    a fourth gate structure spaced from the third gate structure and over the second group of fins;
    a first structure between the first and second groups of fins, the first structure comprising isolation material;
    a second structure at least partially in the first structure such that the second structure is both (1) on the isolation material of the first structure and (2) at least partially between the isolation material of the first structure, the second structure spanning an area between the first, second, third, and fourth gate structures and comprising resistive material;
    a first contact on a first location of the second structure; and
    a second contact on a second location of the second structure.

14. The semiconductor structure of claim 13, wherein the second structure includes at least one of polysilicon, titanium nitride (TiN) and tungsten (W).

15. The semiconductor structure of claim 13, wherein the first structure includes a liner portion and a cap portion, the liner portion including the isolation material, and the cap portion includes another isolation material that is different from the isolation material of the liner portion, and wherein the second structure is between the liner portion and the cap portion.

16. The semiconductor structure of claim 13, wherein the second structure includes a precision resistor.

17. The semiconductor structure of claim 13, wherein the second structure is at least partially enclosed within the first structure.

18. The semiconductor structure of claim 13, wherein the first group of semiconductor fins consists of two semiconductor fins.

19. The semiconductor structure of claim 13, wherein the second group of semiconductor fins consists of two semiconductor fins.

20. The semiconductor structure of claim 13, wherein a sidewall of the first structure abuts a sidewall of at least one of the first gate structure, the second gate structure, the third gate structure, or the fourth gate structure.

* * * * *